United States Patent
Downey et al.

(10) Patent No.: US 10,277,346 B1
(45) Date of Patent: Apr. 30, 2019

(54) HIGH-EFFICIENCY SECONDARY SIGNAL COMBINER

(71) Applicant: The United States of America, as represented by the Administrator of the National Aeronautics and Space Administration, Washington, DC (US)

(72) Inventors: James M. Downey, North Ridgeville, OH (US); Bryan L. Schoenholz, Brunswick, OH (US); Joseph A. Downey, Grafton, OH (US)

(73) Assignee: The United States of America as Represented by the Administrator of National Aeronautics and Space Administration, Washington, DC (US)

( * ) Notice: Subject to any disclaimer, the term of this patent is extended or adjusted under 35 U.S.C. 154(b) by 97 days.

(21) Appl. No.: 15/205,575

(22) Filed: Jul. 8, 2016

Related U.S. Application Data

(60) Provisional application No. 62/190,784, filed on Jul. 10, 2015.

(51) Int. Cl.
*H04J 1/08* (2006.01)
*H04W 72/04* (2009.01)

(52) U.S. Cl.
CPC ........... *H04J 1/08* (2013.01); *H04W 72/0453* (2013.01)

(58) Field of Classification Search
CPC ........ H04J 1/08; H04J 14/02; H04W 72/0453
See application file for complete search history.

(56) References Cited

U.S. PATENT DOCUMENTS

| 6,678,512 B1 * | 1/2004 | Kaminski | H04B 1/28 375/136 |
|---|---|---|---|
| 7,932,845 B2 | 4/2011 | Sheng et al. | |
| 8,243,579 B2 | 8/2012 | Lee et al. | |
| 8,462,868 B2 | 6/2013 | Sun et al. | |
| 8,542,616 B2 | 9/2013 | Staszewski et al. | |
| 8,957,798 B1 * | 2/2015 | Harris | H03M 1/1038 341/118 |
| 2007/0030913 A1 | 2/2007 | Lin | |
| 2009/0190641 A1 | 7/2009 | Yang | |

OTHER PUBLICATIONS

Tokars, Jr., Roger P., Lekki, John D.; title "Self Diagnostic Accelerometer testing on the C-17 aircraft"; IEEE Aerospace Conference, Big Sky, Montana; Mar. 2-9, 2013.
Tokars, Jr., Roger P., Lekki, John D.; title Self Diagnostic Accelerometer Ground Testing on a C-17 Aircraft Engine; IEEE Aerospace Conference, Big Sky, Montana; Mar. 2-9, 2013.

\* cited by examiner

*Primary Examiner* — Kabir A Timory
(74) *Attorney, Agent, or Firm* — Robert H. Earp, III; William M. Johnson

(57) ABSTRACT

A high efficiency secondary signal combiner may include a frequency division multiplexer that is configured to receive two or more signals and produce a combined signal. The combined signal may include the two or more signals, and each of the two or more signals may be in different Nyquist zones. The combiner may also include a wideband analog-to-digital converter (ADC) that is configured to frequency shift the combined signal by sub-sampling the two or more signals to produce a sub-sampled signal in a Nyquist zone that is different from the Nyquist zones of the two or more signals.

17 Claims, 5 Drawing Sheets

HIGH-EFFICIENCY SECONDARY SIGNAL COMBINER

CROSS REFERENCE TO RELATED APPLICATION

This application claims the benefit of U.S. Provisional Patent Application Ser. No. 62/190,784 filed Jul. 10, 2015. The subject matter of this earlier-filed application is hereby incorporated by reference in its entirety.

ORIGIN OF THE INVENTION

The invention described herein was made by employees of the United States Government and may be manufactured and used by or for the Government for Government purposes without the payment of any royalties thereon or therefore.

FIELD

The present invention generally pertains to a signal combiner, and more specifically, to a digital domain signal combiner for wideband receivers.

BACKGROUND

Bit error rate testing may be performed on existing radios, i.e., determining how well a particular communication waveform is performing. More specifically, the bit error rate test may allow a user to benchmark the radio across various levels of signals that are being received relative to the noise, providing the user with a better understanding of how well the particular waveform is performing.

To perform the bit error rate test, additional components, such as signal combiners, directional couplers and attenuators, are typically added in front of the radio receiver. Furthermore, these additional components must be compensated for with respect to their impact to the measurement. Compensation methods may include calibration of additional insertion loss and non-uniform frequency response compared to the nominal state of the radio. Upon completion of the bit error rate test, the additional components must be removed to return the radio receiver back to working condition. Not only is this process cumbersome, but this process also changes the characteristics of the signal that is being measured due to the additional components.

However, such an approach reduces signal power due to conservation of energy. For example, with a power combiner, because the primary signal and the secondary signal are being summed together, a half-power loss may be realized. Similarly, with a directional coupler, a loss may also be realized during the combining (or summation) process.

Radio receivers are typically implemented by using wideband analog-to-digital converters (ADCs). These wideband ADCs may have a broad frequency response covering more than one Nyquist zone. In these instances, an anti-aliasing filter is used to only select a particular portion of the incoming signal to be converted into a digital representation for waveform processing.

SUMMARY

Certain embodiments of the present invention may be implemented and provide solutions to the problems and needs in the art that have not yet been fully solved by conventional coupling technologies. For example, some embodiments of the present invention pertain to high-efficiency secondary signal combiner that may include a multiplexer and a wideband ADC. For example, a multiplexer, such as a diplexer, may allow for the selection of one or more Nyquist zones (or bands), and allow another Nyquist band to fold in, or summed in, with the primary signal. Such a configuration may be advantageous over the current state of the art, which may use a power combiner or a directional coupler. Because the diplexer is used in combination with the wideband ADC to combine the primary signal and the secondary signal in the frequency domain, the signal losses due to the law of conservation of energy is not a limitation for this summing process.

In one embodiment, a system may include a frequency division multiplexer and a wideband ADC. The frequency division multiplexer may receive two or more signals and produce a combined signal. The combined signal may include the two or more signals, and each of the two or more signals may be in different Nyquist zones. The wideband ADC may sub-sample the two or more signals which may frequency shift the combined signals to a common frequency bandwidth.

In another embodiment, a system may include a diplexer and a wideband ADC. The diplexer may combine a first signal and a second signal to generate a combined signal. The wideband ADC may sub-sample the combined signal to produce a sub-sampled digital signal. The first signal is within a Nyquist zone that is different from a Nyquist zone of the second signal.

BRIEF DESCRIPTION OF THE DRAWINGS

In order that the advantages of certain embodiments of the invention will be readily understood, a more particular description of the invention briefly described above will be rendered by reference to specific embodiments that are illustrated in the appended drawings. While it should be understood that these drawings depict only typical embodiments of the invention and are not therefore to be considered to be limiting of its scope, the invention will be described and explained with additional specificity and detail through the use of the accompanying drawings, in which.

DETAILED DESCRIPTION OF THE EMBODIMENTS

According to sampling theory, any signal existing in frequency beyond the Nyquist bandwidth, but within the analog bandwidth of the wideband ADC, may alias or fold down and may be represented in the digital domain by the equivalent image frequency in the first Nyquist zone. Intentional placement of one or more signals within predefined, but different Nyquist zones may cause the wideband ADC to both frequency convert and sum multiply Nyquist zones into a single Nyquist zone. The magnitude of the aliased signals is unchanged, and therefore, the digital frequency conversion can be considered lossless.

Some embodiments generally provide a method for performing bit error rate testing by combining a primary signal with out-of-band noise (or secondary signal), which is placed and completely contained within a separate Nyquist zone. The noise placed in a separate Nyquist zone but within the analog bandwidth of the ADC may fold down during the sampling process and may be combined digitally with the primary signal. This effectively frequency translates the noise and primary signal components to be overlapping. This digital signal combining may require a multiplexer and a specific sampling rate to select the desired Nyquist zones. This enables a lossless method of combining signal and noise to set a desired signal-to-noise ratio as compared to in-band power combining.

In some embodiments, a frequency division multiplexer (FDM) may combine two or more signals in orthogonal frequency bands into a new composite signal. For example, a diplexer may be used to combine two frequency bands. In another example, a triplexer may be used to combine three frequency bands.

It should be appreciated that theoretically, a passive FDM may approach zero combining loss with ideal components. For example, ideal components may include superconducting microwave filters. In practice, however, a combining (or insertion) loss of less than 1 dB may be realized for each frequency band even with an operation of greater than 1 GHz. This is a substantial improvement over standard power combiners, which may have a combining loss of 3 to 4 dB. Alternatively, a directional coupler may have similar loss for the primary signal, however the secondary signal is typically reduced by 10 dB or more. Thus, minimizing insertion loss is important in a radio receiver design, since the excess insertion loss may contribute to the system noise budget and therefore the overall receiver sensitivity.

In certain embodiments, a FDM is used in the analog domain, and the ADC sampling nonlinearity is used to perform summation during digitization. This may allow a substantial increase in signal summation efficiency over the current state of the art.

Figure 1:
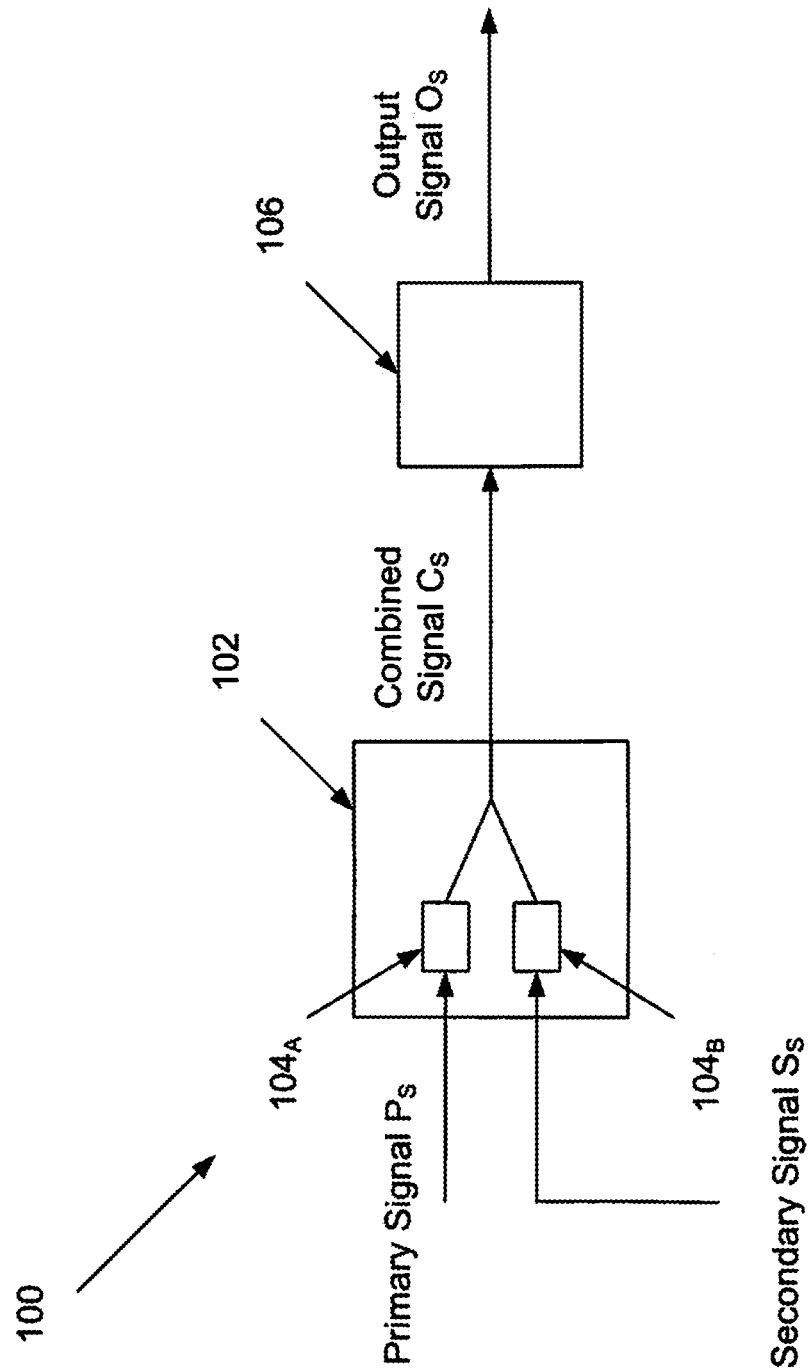
FIG. 1 is a block diagram illustrating a signal combiner, according to an embodiment of the present invention.

FIG. 1 is a block diagram illustrating a signal combiner 100, according to an embodiment of the present invention. In some embodiments, signal combiner 100 may include a diplexer 102 and a wideband ADC 106. It should be appreciated that different types of multiplexers may be used depending on the number of signals that are being received.

For purposes of explanation, diplexer 102 includes mutually exclusive, i.e., non-overlapping, frequencies such as band A and band B. Diplexer 102 may select specific frequency bands that match up to specific Nyquist zones. For example, frequency band A may match up to Nyquist zone 2, and frequency band B may match up to Nyquist zone 3. The selection of the specific frequency bands may be based on the bandwidth of the ADC and the performance of the secondary signal components. For example, if the primary signal is aligned to Nyquist zone 2, it may be easier to create a high quality secondary signal at Nyquist zone 1.

Figure 2:
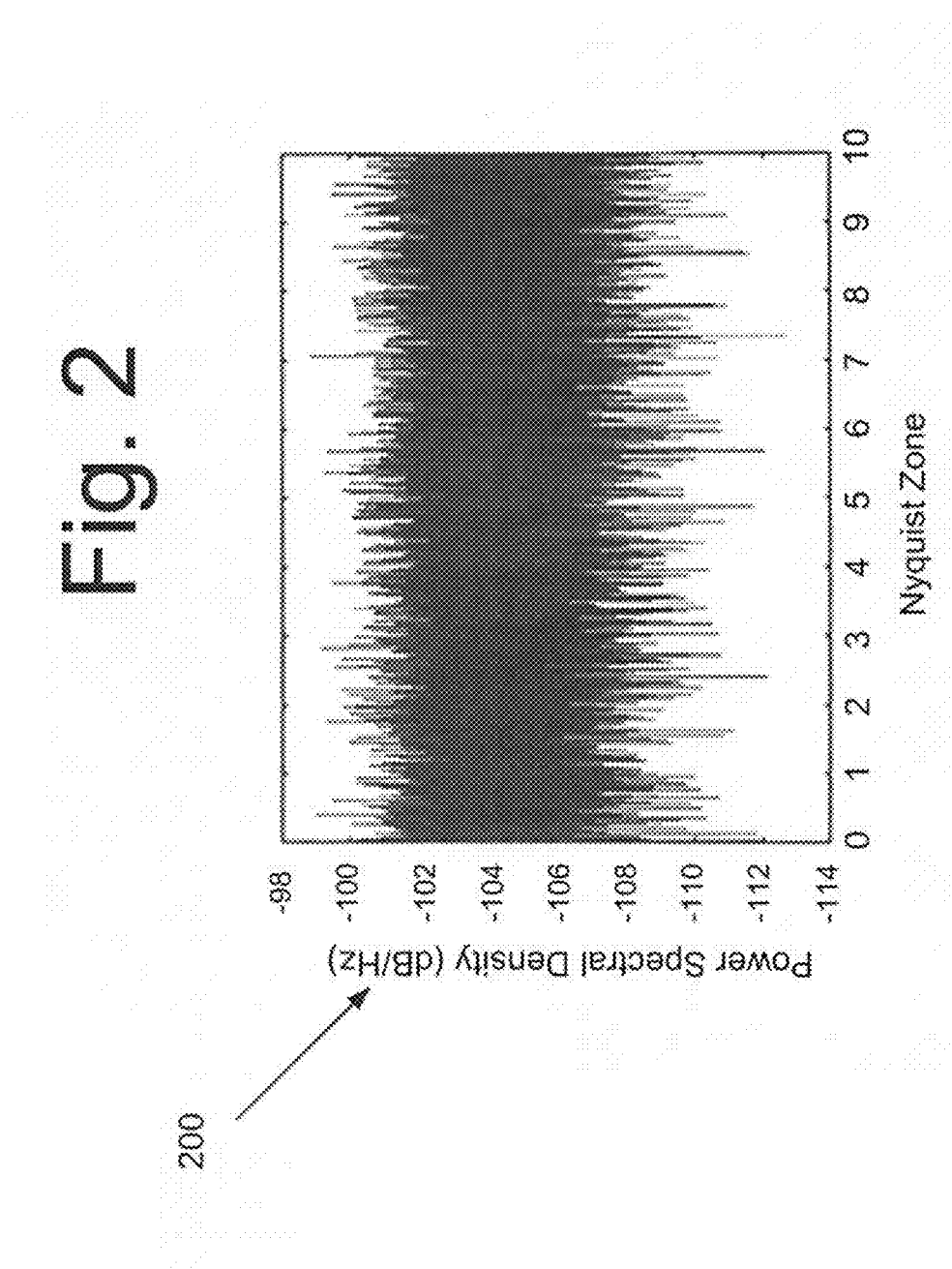
FIG. 2 is a graph illustrating wide band noise, representing the secondary signal input according to an embodiment of the present invention.

As shown in FIG. 1, primary signal $P_S$ (band A) is received at primary input port $104_A$, and a secondary signal $S_S$ (band B) is received at secondary input port $104_B$. In some embodiments, primary signal $P_S$ may be received from an external device, such as an antenna, an amplifier, or another radio. Primary signal $P_S$ may carry a tone in the second Nyquist zone, for example. In the example described herein, secondary signal $S_S$ may include wideband noise in the third Nyquist zone. See, for example, FIG. 2, which is a graph 200 illustrating wide band noise, according to an embodiment of the present invention. Returning to FIG. 1, it should be appreciated the secondary signal $S_S$ may be local to the signal combiner or system. In the embodiments that include more than two signals, any subsequent signal may also be local to the signal combiner.

Figure 3:
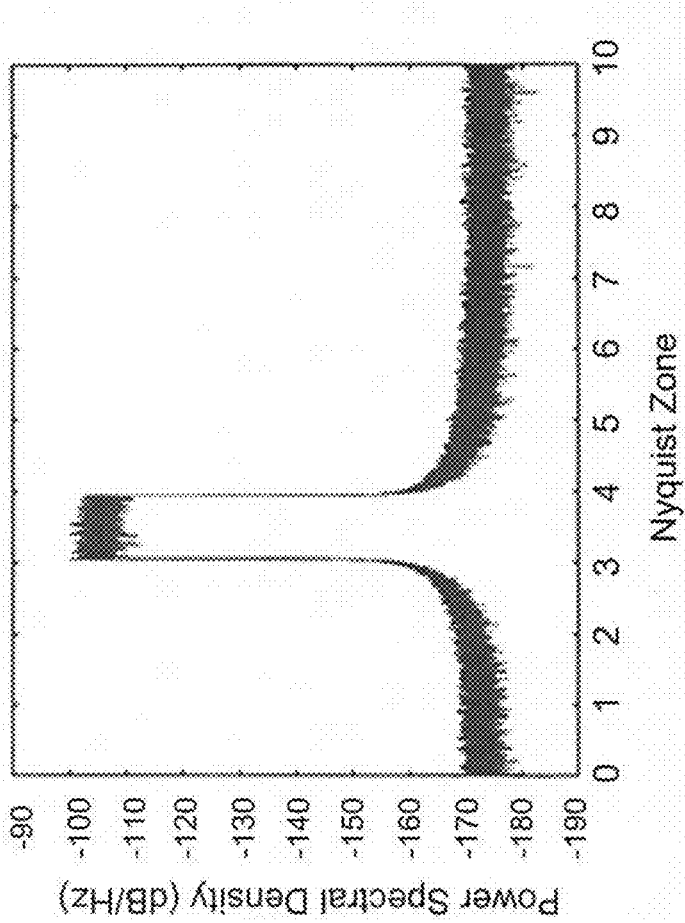
FIG. 3 is a graph illustrating filtered secondary signal, according to an embodiment of the present invention.

In some embodiments, a signal-to-noise ratio may be set by summing secondary signal $S_S$ carrying the wide band noise in the third Nyquist zone with primary signal $P_S$ carrying the tone in the second Nyquist zone. It should be appreciated that in certain embodiments primary signal $P_S$ and secondary signal $S_S$ are in separate frequency bands, and therefore, in separate Nyquist zones. Diplexer 102 may filter primary signal $P_S$ and secondary signal $S_S$, and may combine primary signal $P_S$ and secondary signal $S_S$ to produce a combined signal $C_S$ for a selected Nyquist zone. For instance, the filter bands (not shown) of diplexer 102 may be configured to pass primary signal $P_S$ and secondary signal $S_S$ through the selected Nyquist zones. See FIG. 3, which is a graph 300 illustrating filtered secondary signal, according to an embodiment of the present invention. In graph 300, the wideband noise is filtered by diplexer 102 to select the $4^{th}$ Nyquist zone.

Figure 4:
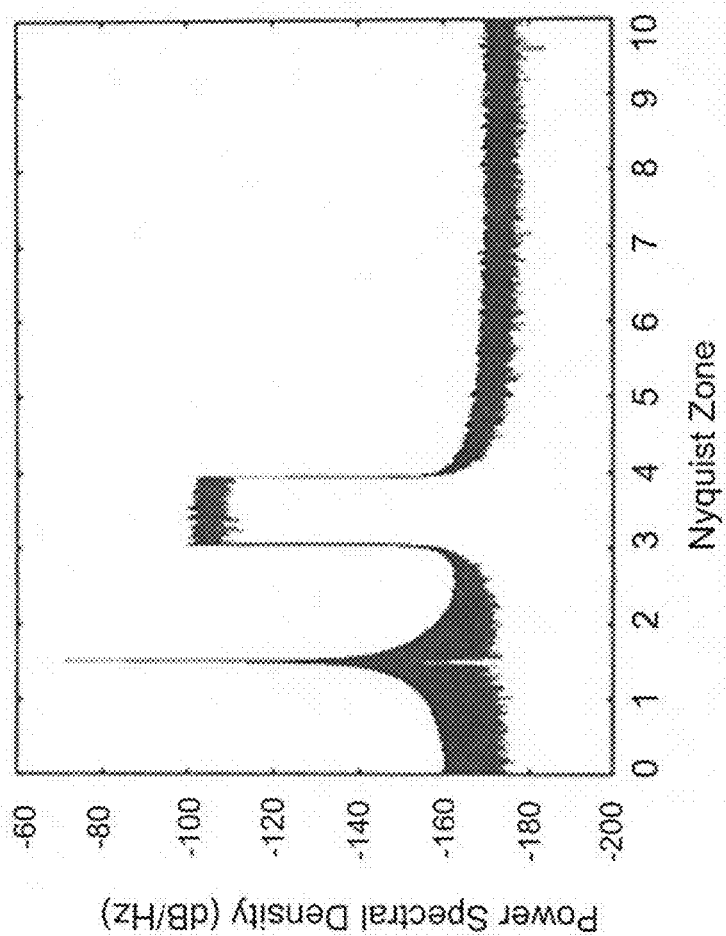
FIG. 4 is a graph illustrating the combined analog signals of both bands, according to an embodiment of the present invention.

Returning to FIG. 1, diplexer 102 may combine primary signal $P_S$ and secondary signal $S_S$, which are in different Nyquist bands, to produce a combined signal $C_S$. See, for example, FIG. 4, which is a graph 400 illustrating combined signal $C_S$ carrying the tone and the noise in both bands, according to an embodiment of the present invention. In graph 400, the analog signal is a combination of primary signal $P_S$ and secondary signal $S_s$ as they appear in separate Nyquist zones.

Returning to FIG. 1, combined signal $C_S$ may be sub-sampled by a wideband ADC 106 to produce a sub-sampled digital signal (or output signal $O_S$). Because a wideband ADC 106 may in certain embodiments use more than Nyquist zone at the same time, combined signal $C_S$, which includes primary signal $P_S$ and secondary signal $S_S$, may be sub-sampled. For example, primary signal $P_S$ and secondary signal $S_S$ may be sub-sampled by selecting the appropriate frequency signal, and folded into the first Nyquist zone. In one example, the tone of primary signal $P_S$, which may be in the second Nyquist zone between 1 and 2, may be folded into the first Nyquist zone between the 0 and 1. Similarly, the noise of the secondary signal $S_S$, which may be in the third Nyquist zone between the 3 and 4, may be folded into the first Nyquist zone between 0 and 1.

Figure 5:
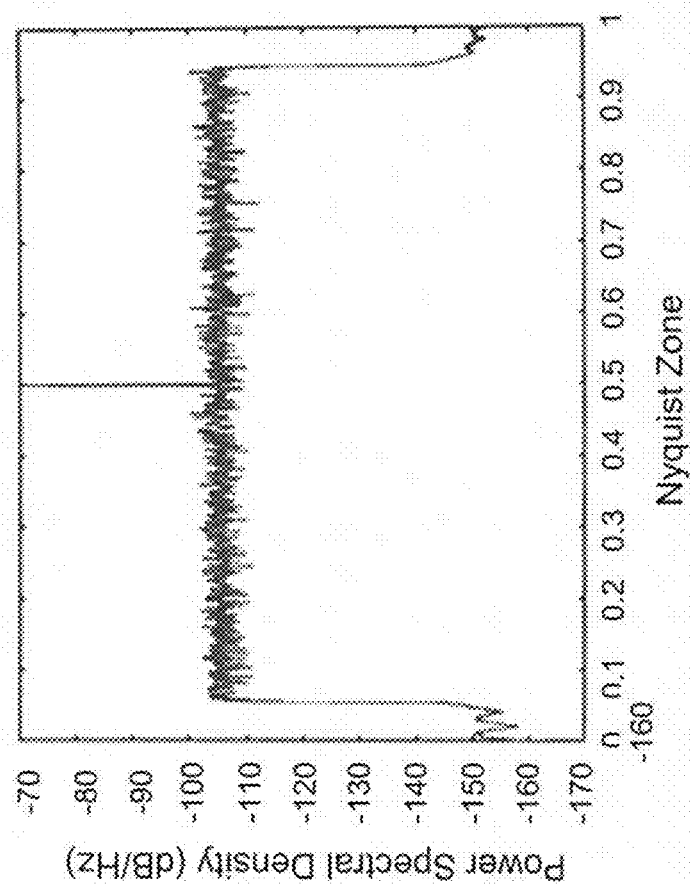
FIG. 5 is a graph illustrating the digitally combined sub-sampled signal, according to an embodiment of the present invention.

Simply put, diplexer 102 may sum (or combine) the signal and noise into the appropriate Nyquist zone and wideband ADC 106 may sub-sample combined signal $C_S$. See, for example, FIG. 5, which is a graph 500 illustrating a sub-sampled signal, according to an embodiment of the present invention.

It should be appreciated that additional requirements may be placed on diplexer 102. For example, the bands in the different Nyquist zones are mutually exclusive, and the bands must align and only select one Nyquist zone per channel in diplexer 102. In a multiplexer with n number of inputs and a single output, for example, each n input may have mutually exclusive frequency bands. In those embodiments, the requirement may require the band to select a single Nyquist zone for a particular wideband ADC.

In other embodiments, a tunable diplexer may be utilized. In those embodiments, the tunable diplexer may change the band edges. Depending on the type of wideband ADC and the sampling rate that is selected, then the tunable diplexer will select the appropriate bands.

Some embodiments of the present invention generally pertain to a signal combiner for wideband receivers. For example, the signal combiner may combine noise with signals for bit-error rate testing, calibration signals for optimizing receiver performance, and multi-carrier signal combining. In some cases, such as multi-carrier combining, spectral inversion may be performed in the analog or digital domain to correct for the spectral inversion that occurs during the aliasing process.

The signal combiner for wideband receivers may lower theoretical loss as compared to the common practice of using an in band power combiner or coupler in place of the diplexer. The signal combiner may also minimize system configuration changes for calibration and allow calibration during system operation as compared to methods using temporary hardware for calibration. The signal combiner may further enable calibration signals to be generated at lower frequencies to reduce cost/complexity, and enable low cost and low power method of frequency conversion.

The features, structures, or characteristics of the invention described throughout this specification may be combined in any suitable manner in one or more embodiments. For example, reference throughout this specification to "certain embodiments," "some embodiments," or similar language means that a particular feature, structure, or characteristic described in connection with the embodiment is included in at least one embodiment of the present invention. Thus, appearances of the phrases "in certain embodiments," "in some embodiment," "in other embodiments," or similar language throughout this specification do not necessarily all refer to the same group of embodiments and the described features, structures, or characteristics may be combined in any suitable manner in one or more embodiments.

It should be noted that reference throughout this specification to features, advantages, or similar language does not imply that all of the features and advantages that may be realized with the present invention should be or are in any single embodiment of the invention. Rather, language referring to the features and advantages is understood to mean that a specific feature, advantage, or characteristic described in connection with an embodiment is included in at least one embodiment of the present invention. Thus, discussion of the features and advantages, and similar language, throughout this specification may, but do not necessarily, refer to the same embodiment.

Furthermore, the described features, advantages, and characteristics of the invention may be combined in any suitable manner in one or more embodiments. One skilled in the relevant art will recognize that the invention can be practiced without one or more of the specific features or advantages of a particular embodiment. In other instances, additional features and advantages may be recognized in certain embodiments that may not be present in all embodiments of the invention.

One having ordinary skill in the art will readily understand that the invention as discussed above may be practiced with steps in a different order, and/or with hardware elements in configurations which are different than those which are disclosed. Therefore, although the invention has been described based upon these preferred embodiments, it would be apparent to those of skill in the art that certain modifications, variations, and alternative constructions would be apparent, while remaining within the spirit and scope of the invention. In order to determine the metes and bounds of the invention, therefore, reference should be made to the appended claims.

The invention claimed is:

1. A system, comprising:
a frequency division multiplexer configured to receive two or more signals and produce a combined signal comprising the two or more signals, wherein each of the two or more signals are in different Nyquist zones; and
a wideband analog-to-digital converter (ADC) configured to sub-sample the two or more signals to frequency shift the two or more signals such that the two or more signals overlap within a single Nyquist zone, wherein a first signal of the two or more signals has a smaller bandwidth than a second signal of the two or more signals, wherein the smaller bandwidth is contained within a larger bandwidth of the second signal in the single Nyquist zone after being sub-sampled by the wideband ADC.

2. The system of claim 1, wherein one of the two or more signals is a primary signal that is received from a source external to the system.

3. The system of claim 1, wherein at least one of the two or more signals is a secondary signal that is received from a source internal to the system.

4. The system of claim 1, wherein the wideband ADC is configured to sub-sample the two or more signals at a sampling frequency selected based on a bandwidth of the wideband ADC and a performance of secondary signal components.

5. The system of claim 1, wherein the frequency division multiplexer is configured to filter each of the two or more signals prior to combining the two or more signals into the combined signal.

6. The system of claim 1, wherein the single Nyquist zone is distinct from a first Nyquist zone containing the first signal and a second Nyquist zone containing the second signal.

7. A system, comprising:
a diplexer configured to combine a first signal and a second signal to generate a combined signal; and
a wideband analog-to-digital converter (ADC) configured to sub-sample the combined signal such that the two or more signals overlap within a first Nyquist zone, wherein the first signal has a smaller bandwidth than the second signal, wherein the first signal is spectrally contained within a larger bandwidth of the second signal in the first Nyquist zone after being sub-sampled by the wideband ADC, wherein
the first signal is within a different Nyquist zone than the second signal.

8. The system of claim 7, wherein the diplexer is further configured to receive the first signal from a source that is external to the system.

9. The system of claim 7, wherein the diplexer is further configured to receive the second signal from a source that is internal to the system.

10. The system of claim 7, wherein the first signal and the second signal are in mutually exclusive frequency bands.

11. The system of claim 10, wherein the diplexer is tunable and configured to select a first frequency band for the first signal and a second frequency band for the second signal, wherein the selection of the frequency bands for each of the first signal and the second signal is based on a bandwidth of the wideband ADC and a performance of second signal components.

12. The system of claim 7, wherein the diplexer is further configured to filter the first signal and the second signal prior to combining the first signal and the second signal into the combined signal.

13. The system of claim 7, wherein the first Nyquist zone is different from the Nyquist zone of the first signal and the Nyquist zone of the second signal.

14. The system of claim 13, wherein the first Nyquist zone is between zero and a sub-sampling frequency of the wideband ADC.

15. A method for performing bit error rate testing comprising
   combining, by a multiplexer, a primary signal with out-of-band noise to produce a combined signal, wherein the primary signal is in a Nyquist zone that is different from a Nyquist zone of the out-of-band noise; and
   folding, by an analog-to-digital converter (ADC), the out-of-band noise to be digitally combined with the primary signal, causing components of the out-of-band noise and components of the primary signal to spectrally overlap within a combining Nyquist zone, wherein the out-of-band noise has a wider bandwidth than the primary signal, wherein the primary signal is spectrally contained within the wider bandwidth in the combining Nyquist zone after the folding.

16. The method of claim 15, wherein the combining Nyquist zone is a first Nyquist zone of the ADC.

17. The method of claim 15, wherein the combining Nyquist zone is distinct from the Nyquist zones of the primary signal and the out-of-band noise.

* * * * *